United States Patent [19]

Shishikura et al.

[11] Patent Number: 4,672,612
[45] Date of Patent: Jun. 9, 1987

[54] ERROR CORRECTION SYSTEM IN A TELETEXT SYSTEM

[75] Inventors: Hirohisa Shishikura; Ichiro Sase; Akio Yanagimachi; Osamu Yamada, all of Tokyo; Shigeharu Ueguri, Ibaragi, all of Japan

[73] Assignees: OKI Electric; Nippon Hoso Kyokai; Victor Co., all of Tokyo, Japan

[21] Appl. No.: 716,027

[22] Filed: Mar. 26, 1985

[30] Foreign Application Priority Data

Mar. 30, 1984 [JP] Japan .................. 59-060904
Mar. 30, 1984 [JP] Japan .................. 59-060905

[51] Int. Cl.$^4$ ............................................ G06F 11/10
[52] U.S. Cl. .......................................... 371/37; 371/38
[58] Field of Search .................. 371/37, 38, 39, 40, 371/41, 42, 43, 45, 46

[56] References Cited

U.S. PATENT DOCUMENTS

| | | | |
|---|---|---|---|
| 3,873,971 | 3/1975 | En | 371/43 |
| 4,035,767 | 7/1977 | Chen | 371/43 |
| 4,119,945 | 10/1978 | Lewis | 371/43 |
| 4,317,202 | 2/1982 | Markwik | 371/43 |
| 4,476,458 | 10/1984 | Dollard | 371/43 |
| 4,541,095 | 9/1985 | Vries | 371/37 |
| 4,555,784 | 1/1985 | Wood | 371/37 |
| 4,564,945 | 1/1986 | Glouer | 371/38 |
| 4,593,374 | 6/1986 | Gurumurthy | 371/37 |
| 4,597,083 | 6/1986 | Stevenson | 371/37 |
| 4,599,722 | 7/1986 | Morhmer | 371/37 |

Primary Examiner—Michael R. Fleming
Attorney, Agent, or Firm—Martin M. Novack

[57] ABSTRACT

An error correction system for a difference set cyclic (272, 190) code with 190 data bits and 82 test bits in a packet which is transmitted on a vertical blanking interval of a television signal has been improved. The present system comprises a buffer memory for storing an original data which is subject to correction and corrected data, and an error correction circuit having at least a syndrome register, a majority circuit and a data register. The data transfer between the buffer memory and the error correction circuit is effected by wired logic hardware means without using software operation time of a programmed computer so that computer operation time is not wasted merely for error correction. A correction number counter is provided for counting the number of corrected bits for adjusting the threshold level for determining 1 or 0 of a reception signal, adjusting criterion of operation of the majority circuit in the error correction circuit, and the stopping of error correction operation in case of too many errors.

5 Claims, 10 Drawing Figures

Fig. 6

| ADDRESS | STORED DATA |
|---|---|
| 0 ~ 63 | FIRST PACKET |
| 64 ~ 127 | SECOND PACKET |
| 128 ~ 191 | THIRD PACKET |
| 640 ~ 703 | 11'TH PACKET |
| 704 ~ 767 | 12'TH PACKET |
| 768 ~ 1023 | NOT USED |

Fig. 9

| ADDRESS | STORED DATA | |
|---|---|---|
| 1024 | ERROR INFORMATION | FIRST PACKET |
| 1025 ~ 1087 | 24 BYTES | |
| 1088 | ERROR INFORMATION | SECOND PACKET |
| 1089 ~ 1151 | 24 BYTES | |
| 1152 | ERROR INFORMATION | THIRD PACKET |
| 1153 ~ 1215 | 24 BYTES | |
| ≈ | ≈ | |
| 1664 | ERROR INFORMATION | 11'TH PACKET |
| 1665 ~ 1727 | 24 BYTES | |
| 1728 | ERROR INFORMATION | 12'TH PACKET |
| 1729 ~ 1791 | 24 BYTES | |
| 1792 ~ 2047 | NOT USED | |

ERROR CORRECTION SYSTEM IN A TELETEXT SYSTEM

BACKGROUND OF THE INVENTION

This invention is concerned with a code error control system which is well suited for use in a teletext broadcast, where character and figure digital information is transmitted in a multiple mode during the vertical retrace blanking period of a TV signal. In particular, the invention is concerned with a code error correction decode circuit that can recover as many bit errors as possible which take place during transmission by means of error-correction.

An error correcting data transmission system of this kind using a TV channel is described in Japanese patent laid open publications Nos. 133751/84, 181841/84, and 216388/84, where data are first coded in packets, then transmitted and decoded with error correction facility. One packet consists of 272 bits, of which 190 bits are information bits and the remaining 82 bits are parity bits.

The circuit construction of a code error correction decode circuit used in the above system is shown in FIG. 1. In FIG. 1, 1 stands for a CPU bus line which is connected to a CPU (which is not shown in FIG. 1), the input terminal of output port 2, and the output terminal of input port 3. Output port 2 provides original data 5 to error correction circuit 4. Error correction circuit 4, which contains a parallel-serial converter, a serial-parallel converter, a syndrome register, and so on, corrects (272,190) code data. Error correction circuit 4 provides corrected data 6 and error status signal 7 to the said input port 3.

Now, operations which take place in the diagram of FIG. 1 will be described. First, original data are provided to output port 2 from CPU via CPU bus line 1. The original data received by output port 2 get corrected in error correction circuit 4 and are converted to corrected data 6. Corrected data 6 are provided to input port 3 and then sent to CPU via CPU bus line 1.

On the completion of error correction of one packet of data, error correction circuit 4 generates error status signal 7 that indicates the condition of the syndrome register, i.e., whether it is "0" or not, and sends it on CPU bus line 1 by way of input port 3. The "0" condition of the syndrome resistor means that either original data are error-free or they are corrected completely. Therefore, CPU gets information on validity of corrected data 6 on CPU bus line 1 by examining the error status signal.

The conventional technique explained above, however, has the following drawbacks.

In FIG. 1, suppose that signals are transferred between CPU and error correction circuit 4 in units of 8 bits=1 byte via CPU bus line 1. Then 34 byte-times are required for CPU to provide 1 packet (=272 bits) of original data to the error correction circuit, and the same amount of time is necessary for the error correction circuit to provide 1 packet of corrected data to CPU.

Moreover, in the Japan's teletext broadcast, it is possible to send up to 12 packets of data in one vertical period (=16.67 ms) and the total transfer time for 12 packs of data between CPU and the error correction amounts to as much as 816 byte-times (=34×2×12). These transfer operations are performed by write and read commands provided by CPU, and during the period for transfer operations CPU is so often required by them that it has not enough time for other jobs in the teletext broadcast such as decoding and generating display format. In particular, as the error correction process of error correction circuit 4 is performed asynchronously with the operation of CPU, CPU should detect every time when the error correction of one packet of original data gets completed, and upon detection of it, CPU issues a command necessary for the resulting corrected data provided by input port 3. Therefore, other jobs for which CPU is responsible during the same period of time are so often interrupted.

As explained above, in the conventional technique, one circuit of which is shown in FIG. 1, so much CPU time is required for the job of error correction that CPU cannot control all the other jobs necessary for the receiving and display required in the teletext broadcast.

In the second place, in the circuit shown in FIG. 1, it is only possible to know that data corrected in the correction circuit are completely correct or not, and information concerning the number of corrected bits is unavailable. It is necessary to judge the instant signal value to be "1" or "0" at each time point in order to convert received code data into their corresponding digital code, and for this purpose a correctly chosen threshold voltage is necessary. To obtain a correctly chosen threshold voltage, a feedback process is necessary between threshold voltage and the corresponding error which occured with it.

In the third place, though an invention of repeating a correction process with varying threshold values for a majority circuit used in it is described in said Japanese patent laid open publication No. 181841/84, the invention is no longer effective when original data contain too many error-bits. In this case, the repetition of a correction process means simply a waste of time.

Moreover, in the above case of too many error bits, the repetition of a correction process may result in an increase in error bits.

SUMMARY OF THE INVENTION

It is an object, therefore, of the present invention to overcome the disadvantages and limitations of a prior error correction system in a teletext broadcast system by providing a new and improved error correction system.

It is also an object of the present invention to provide an error correction system which has a buffer memory for storing both data to be corrected, and corrected data, wherein data transfer between the buffer memory and the error correction circuit is accomplished by hardware means without using CPU time in software operation.

It is also an object of the present invention to provide an error correction system which has a counter that counts the number of corrected bits taken place in the course of correction. The counted number obtained by the counter is sent as error information with the corresponding correct data for convenience of further processing in CPU. And, if the counted number exceeds a predetermined value, the correction process in progress is forced to stop to avoid an unnecessary waste of time.

The above and other objects are attained by an error correction system having an error correction circuit having at least a syndrome register, data register and a majority circuit to correct an error in a packet; a buffer memory for storing an original data which is subject to correction and corrected data; a local data bus for coupling said buffer memory and said error correction circuit; an address switching circuit for switching an address of said buffer memory between an address signal supplied by said error correction circuit and an address signal from an external circuit; a data bus control circuit for coupling either said local data bus or a bus of an external circuit with said buffer memory; wherein data transfer between said buffer memory and said error correction circuit is effected by wired logic hardware means without using software operation time of a programmed computer.

Preferably, a correction number counter is provided so that number of corrected bits is counted for the determination of threshold level of a reception signal, the adjustment of criterion of operation of the majority circuit in the error correction circuit, and the stop of the error correction operation when there are too many errors for correction.

BRIEF DESCRIPTION OF THE DRAWINGS

The foregoing and other objects, features, and attendant advantages of the present invention will be appreciated as the same become better understood by means of the following description and accompanying drawings wherein;

FIG. 6 is a data mapping chart in storage areas of a buffer memory,

FIG. 9 is still another data mapping chart in storage areas of the buffer memory.

DESCRIPTION OF THE PREFERRED EMBODIMENTS

Figure 2:
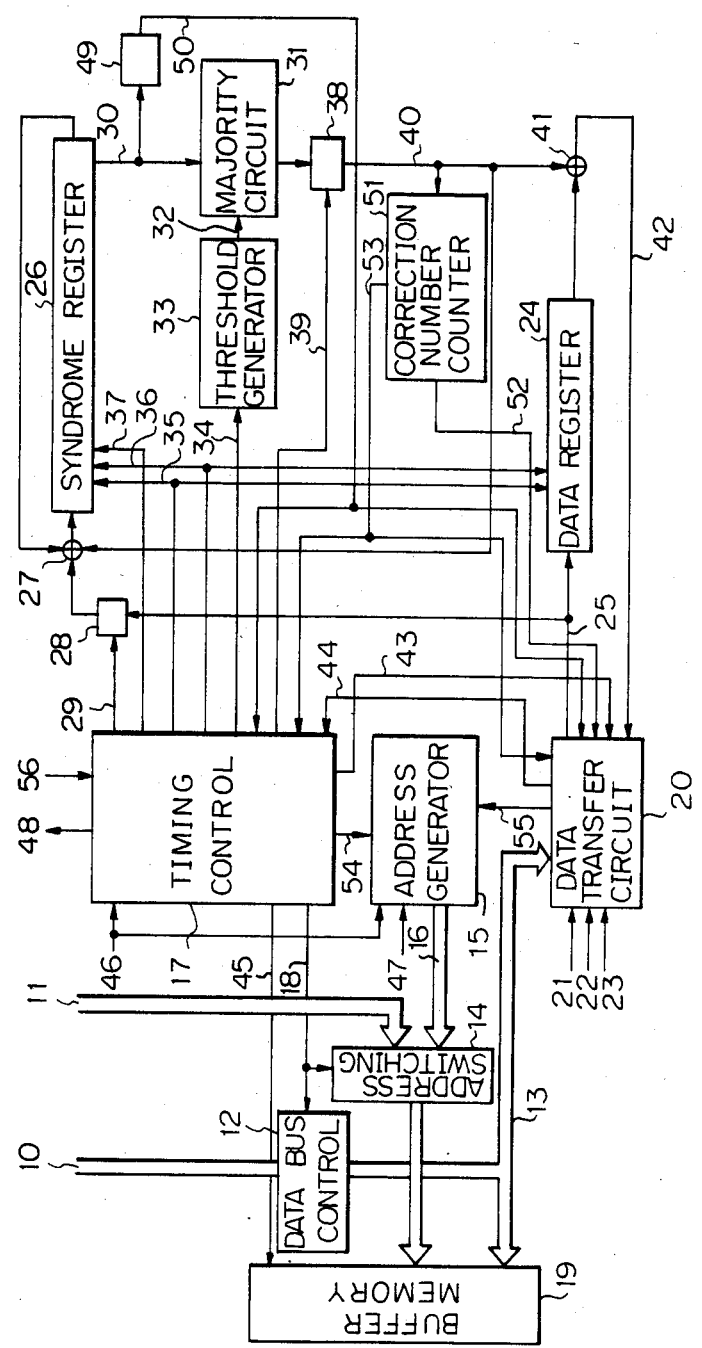
FIG. 2 is a block diagram of an embodiment of the present invention.

FIG. 2 shows a circuit diagram of the first embodiment. In FIG. 2, 10, 11, stand for a CPU's data bus, and a CPU's address bus respectively. (CPU is not shown in FIG. 2). CPU's data bus 10 is connected to the first input-output terminal of data bus control circuit 12, and local data bus 13 is connected to the second input-output terminal of the said data bus control circuit. The said CPU's address bus 11 is connected to the first input terminal of address switching circuit 14, and address generation circuit 15 provides automatic address signal 16 to the second input terminal of address switching circuit 14. Address switching circuit 14, controlled by bus control signal 18 from timing control circuit 17, provides the address input terminal of buffer storage 19 with a storage-address signal which is either a CPU's address signal sent to its first input terminal or automatic address signal 16 sent to its second input terminal.

Local data bus 13 is also connected to the data input-output terminal of buffer storage 19 and the data input-output terminal of data transfer circuit 20. Therefore, data can be transferred between any two of CPU, buffer storage 19, and data transfer circuit 20.

Serial received data 21 that represent the packeted data received and sampled at a receiving station (not shown in FIG. 2.) of the coded transmission teletext, framing detection signal 22 that shows frame synchronization is all right by means of a framing signal of the coded transmission teletext, and synchronous clock 23 that is synchronous with the clock-run-in of the coded transmission teletext are provided to data transfer circuit 20.

Data register 24 is for storage and shifting of a packet of received data (=272 bits) or 190 bits of them, i.e., information bits. It receives original data 25 that get a parallel-serial conversion in data transfer circuit 20 and shifts them. Syndrome register 26 is of the same type as that shown in FIG. 10 of the Japanese patent laid open publication No. 133751/84. It has a storage capacity of 82 bits and has a feedback loop constructed with modulo-2 adder 27. Controlled by load gate signal 29 from timing control circuit 17, load gate circuit 28 sends original data 25 to syndrome register 26 via adder 27.

The numeral 30 stands for a syndrome register signal, 31 for a majority circuit, 32 for a threshold value signal, 33 for a threshold value generation circuit, 34 for a threshold value clock for use in updating threshold value, 35 for a load clock signal for use in loading data to syndrome register 26 and data register 24, 36 for a correction clock signal, 37 for a clear signal for use in clearing syndrone register 26, 38 for a correct gate circuit which receives the output signal of majority circuit 31, and controlled by correct gate signal 39, sends it as error correction signal 40 to adder 41, 42 for corrected data, 43 for a clock signal for use in triggering a serial-parallel or parallel-serial conversion, 44 for a write-pulse signal for use in loading received data to buffer storage 19, 45 for a write-pulse signal for use in loading data to buffer storage 19. Reference numeral 46 stands for a vertical blanking signal or a signal that works like the vertical blanking signal, 47 for a horizontal synchronization signal or a horizontal blanking signal, and 48 for a status signal that indicates working condition.

The reference numeral 49 stands for a register that is set whenever syndrome register 26 becomes "0", whose output signal, i.e., error status signal 50 is provided to the said data transfer cricuit 20. 51 stands for a correction number counter that counts corrected bits occurring in correction process, and sends correction number signal 52 to data transfer circuit 20. It also sends correction exceed signal 53 to both timing control circuit 17 and data transfer circuit 20 if the said number of corrected bits exceed a predetermined value.

Signals denoted by 54 and 55 and are address-updating signals, and 56 stands for a CPU's request signal.

Now, there will be set forth an explanation of how the circuitry of FIG. 2 works.

There are four major operation modes. That is, (1) In the first operation mode, serial received data get serial-parallel converted and are loaded into the buffer storage.

(2) In the second operation mode, original data stored in the buffer storage are read out and loaded into the data register and the syndrome register.

(3) In the third operation mode, error correction is obtained by means of repeating a correction process with varying threshold values for the majority circuit.

During the correction process, the data register and the syndrome register are circulating.

(4) In the fourth operation mode, corrected data are loaded into the buffer storage.

After that, CPU reads out corrected data stored in the buffer storage. This may be called the fifth operation mode.

Figure 3:
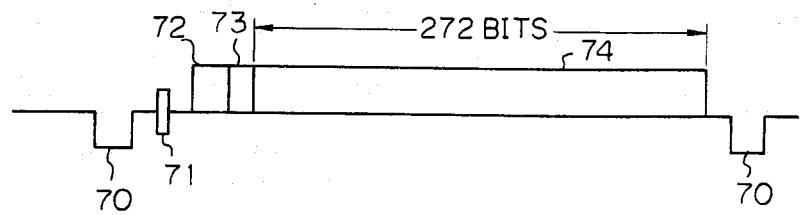
FIG. 3 is a timing chart for explanation of the embodiment of FIG. 2.

FIG. 3 is for explaining the first operation mode, that indicates a timing relationship of receiving a packet of data in a teletext broadcast. In FIG. 3, 70 stands for a horizontal synchronization signal, 71 stands for a color burst, 72 stands for a clock-run-in that consists of 16 bits and is for use in synchronizing, 73 stands for a framing signal for use in frame synchronizing, and 74 stands for a packet of data (=272 bits) that is a part of serial received data 21.

Data transfer circuit 20 can detect the starting time of serial received data 21 by receiving framing detection signal 22 that shows frame synchronization is obtained by means of framing signal 73. As data transfer circuit 20 receives synchronous clock 23 that is synchronus with clock-run-in 72, it converts serial received data 21 in order from serial to parallel for a time of 272 data bits. If the capacity of local data bus 13 is 8 bits, every arrived 8 bits of serial received data 21 are sent out on the local data bus. Suppose that the first address in an area of the buffer storage that stores a packet of original data is α, at each sending of 8-bit data transfer circuit 20 gives address updating signal 55 to address generation circuit 15 and its output signal i.e., automatic address signal 16 advances to α+1, α+2, α+3, ----. Also, at each sending of 8-bit data write-pulse signal 44 is sent to timing control circuit 17, and is provided to buffer storage 19 as write-pulse signal 45.

In the first operation mode, data bus control circuit 12 works to separate CPU's data bus 10 and local data bus 13, and CPU's data bus 10 is available for some other job. And address switching circuit 14 selects automatic address signal 16 from its two inputs, that is sent from address generation circuit 15, and sends it to the address input terminal of buffer storage 19.

Figure 4:
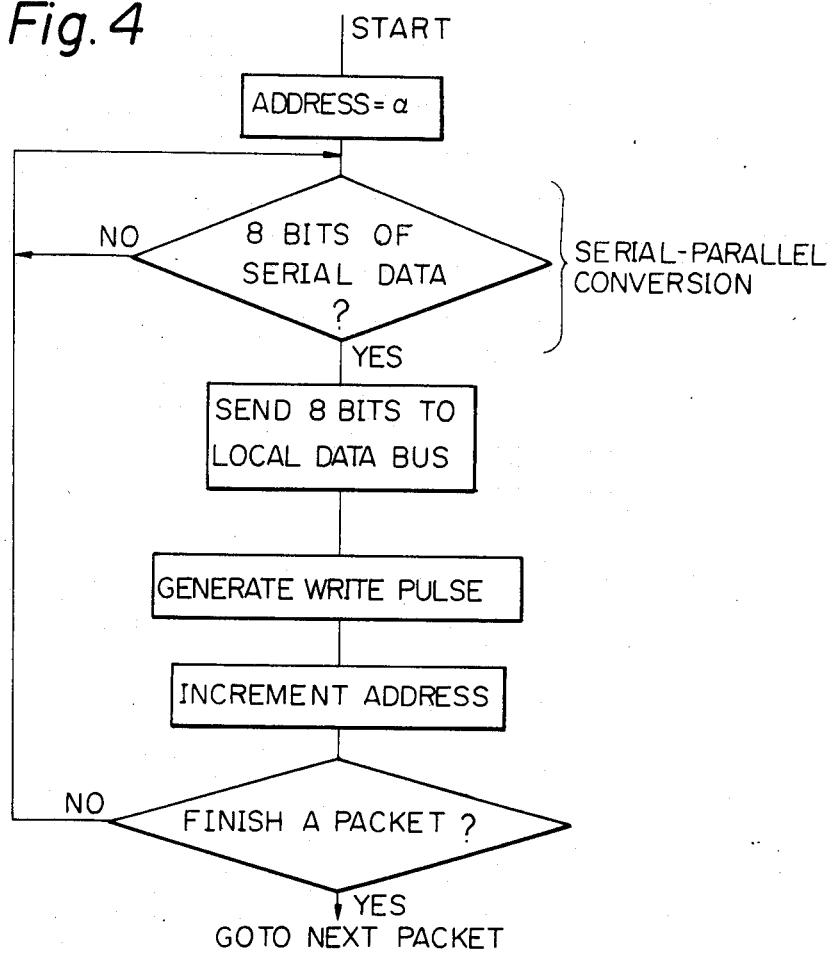
FIG. 4 is a flow diagram for the explanation of the embodiment.

Thus, one packet of data (=272 bits) of serial received data 21 gets serial-parallel converted and is loaded in the area of buffer storage 19 in order starting from address α. FIG. 4 shows a flow diagram for the process of receiving one packet of data of serial received data 21 and loading it into buffer storage 19. As 8 bits=1 byte of data is a unit of operation, 34 (=272/8) loading operations are necessary to store one packet of data, and the corresponding addresses are given as α, α+1, α+2, α+3, ..., α+33.

Figure 5:
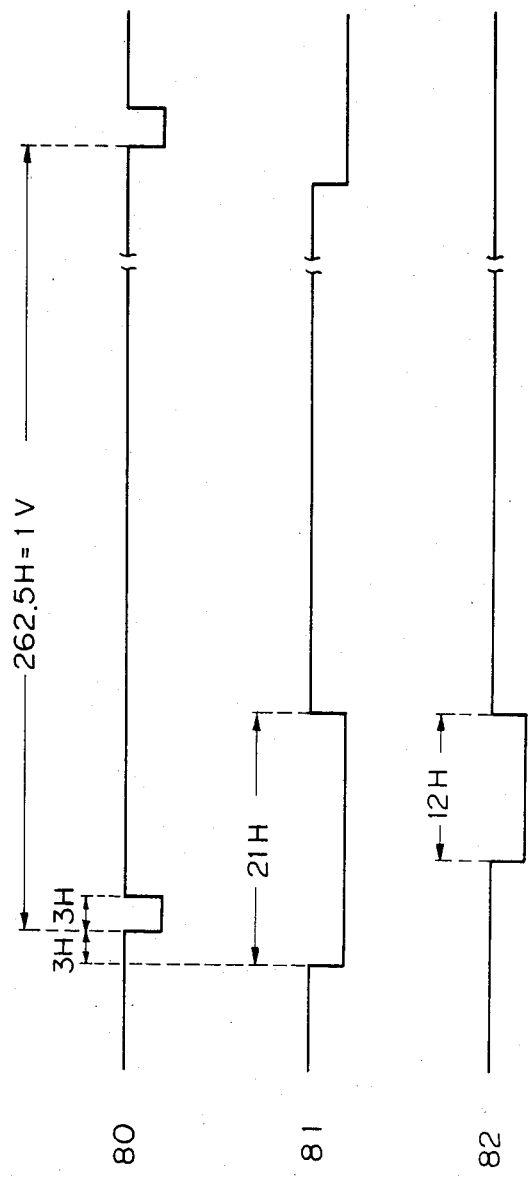
FIG. 5 is another timing chart for explanation of the embodiment of FIG. 2.

In the Japan's teletext broadcast, up to 12 packets of data can be sent during one vertical blanking time, and this fact is shown in FIG. 5. In FIG. 5, a vertical synchronization signal is denoted by 80, a vertical blanking signal is denoted by 81, and a signal denoted by 82 is one derived from vertical blanking signal 81. That is, of a vertical blanking time (=21H) of vertical blanking signal 81, last half part (=12 H) is assigned to signal 82 as shown in FIG. 5.

In the Japan's teletext broadcast, data can be sent during a period when signal 82 is in "L", that is the last half part of a vertical blanking time (=12 H). For example, signal 46 shown in FIG. 2 is signal 82. Address generation circuit 16 counts horizontal synchronization signal 47 during the period when signal 46, i.e., signal 82, is in "L" and gives a part of signal of automatic address signal 16. Therefore, when the transfer of a packet of data is completed, it changes to the address of an area to which the next packet of data is to be loaded. In this way, in repeating the process of 12 times, 12 packets of original data are stored in buffer storage 19. FIG. 6 shows, as an example, a relationship between packet numbers and their assigned addresses in the buffer storage. Though a storage area of 34 addresses is enough for a packet of data, that of 64 addresses is assigned to a packet of data in FIG. 6 for simple structure of the address generation circuit. Therefore, the last half part of a storage area of 64 addresse (=that of 30 addresses) remains unused. When 12 packets of original data are loaded into buffer storage 19, signal 81 and signal 82 in FIG. 5, and accordingly signal 46 in FIG. 2, turn to "H" from "L". And this is the end of the first operation mode.

In FIG. 5, when vertical blanking signal 81 or signal 82, that is, signal 46 in FIG. 2, turns to "H" from "L", the second operation mode begins. In the second operation mode, data bus control circuit 12 works to separate CPU's data bus 10 and local data bus 13 as in the first operation mode, and address switching circuit 14 selects automatic address signal 16 provided by address generation circuit 15 and sends it to the address input terminal of buffer storage 19. Address generation circuit 16 receives address updating signal 54 from timing control circuit 17 and performs required address updating.

In the second operation mode, data are read out, 8 bits at a time, from buffer storage 19 one after another starting from address 0, and get parallel-serial converted in data transfer circuit 20, and are sent out as original data 25 to the data input terminal of data register 24 and to the first input terminal of adder 27 via load gate circuit 28. A packet of data, obtained by means of 34 successive read-out operations from buffer storage 19, gets parallel-serial converted and is loaded to data register 24 and syndrome register 26. Error detection is performed by the syndrome thus obtained. That is, when syndrome signal 30 contains no "1", i.e., all the components are "0"s, there is no data error. If any of its components is "1", some data errors exist. In cases of no data error, the third operation mode in which error correction is performed, is unnecessary. In the present embodiment, however, even in these cases, the third operation mode is explanined.

The error correction system used in this embodiment is basically the same as that explained in said Japanese patent laid open publication No. 133751/84, where the repetition method of correction with descending threshold values is explained in the Japanese patent laid open publicaiton No. 181841/84. Some of the features of this embodiment are equipment with a correction number counter that counts the number of corrected bits, sending out of a correction number signal that indicates the correction number and an error status signal, and causing the correction process in progress to stop when the correction number exceeds a predetermined value.

When the second operation mode comes to end, that is, data loading into data register 24 and into syndrome register 26 gets completed, the third operation mode begins automatically, In the third operation mode, timing control circuit 17 generates correction clock signal 36 which is sent to both data register 24 and syndrome register 26 to shift their contents. And load gate circuit 28 gets to be "off" while correct gate circuit 38 gets to be "on". An exlcusive-or circuit (or a modulo-2 adder), denoted by 41, performs error correction. Error correction signal 40 is generated by means of comparison at majority circuit 31, between threshold values (the initial threshold value is 17) and 17 linear combinations with the 82 components of syndrome register 26.

This error correction signal 40 passes through correct gate 38 that is controlled by correct gate signal 39, only in error correction period. Moreover, when error correction signal 40 has an error in one of its bit positions, it modifies syndrome register 26 to avoid the influence of the error bit. Corrected data 42 generated at the exclusive-or circuit, are again fed back to the data input terminal of data register 24. Before initiating the process of error correction, it is necessary to advance syndrome register 26 by one bit-position. This is because the (272, 190) code for error correction is derived from a (273, 191) majority code by removing 1 bit. Thus, in shifting 272 bits (in syndrome register total shifts are 273 bits), a packet of data is recovered. At this time, error status signal 50 tells whether the data thus obtained are exactly corrected or not. If all the bit-components of syndrome register 26 are not "0"s, it means there are still some errors contained in the recovered data, another process of error correction gets started. The threshold value used in the second process, however, is smaller than the previous one by 1, which is generated at threshold value generation circuit 33. In threshold value generaton circuit 33, the threshold value held in it is subtracted by 1 whenever it receives threshold value clock 34 that is sent from timing control circuit 17. That is, a new threshold value used in the second process is 16 (=17−1), and the second process of error correction gets started with the data obtained by the first process.

In this way, the process of error correction with a varying threshold value is repeated until the time when the process with the threshold value 9 is completed. If every bit of syndrome register 26 is "0" at the tine when a process of error correction whose threshold value is larger than 9 is completed, the data obtained at the time are exactly correct data and the further repetition is unnecessary.

On the contrary, if initial data contain too many error-bits to be corrected by the error correction method explained above, it is better to stop error correction in the middle of the repetition, i.e., before the time when the threshold value reaches 9. For this purpose, correction number counter 51 that counts the number of corrected bits generates correction exceed signal 53, if the counted number exceeds a predetermined value, and provides it to the timing control circuit 17.

Figure 7:
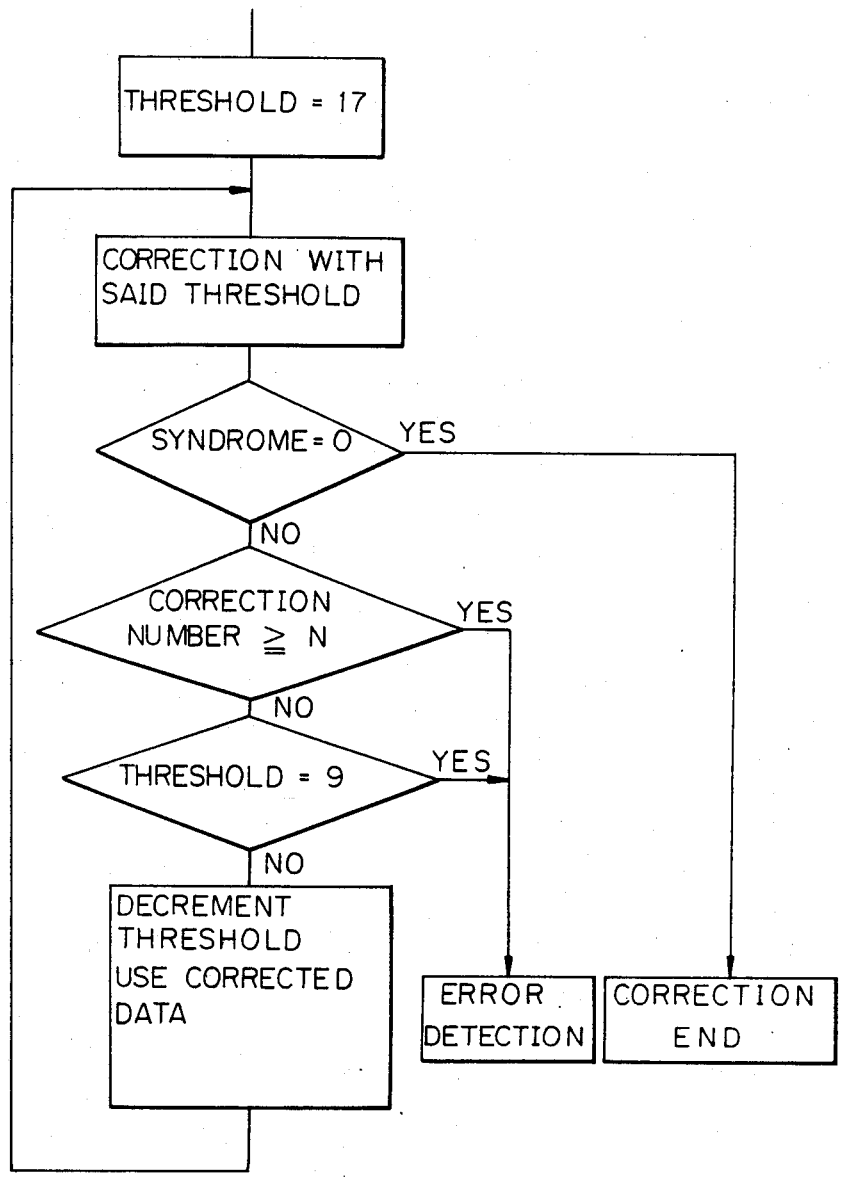
FIG. 7 is another flow diagram for the explanation of the embodiment.

FIG. 7 shows a flow chart of operations carried out in the third operation mode.

As explained above, when the third operation mode is over, corrected data are held in data register 24. When the third operation mode gets completed, the fourth operation mode follows automatically. In the fourth operation mode, corrected data get serial-parallel, converted and loaded into buffer storage 19. In the first place, before sending corrected data to buffer storage 19, error status signal 50, correction exceed signal 53, and correction number signal 52 are sent out on local data bus 13, and are loaded in the first address location of the area in buffer storage 19 where the corrected data are to be loaded. Then, the information bits (=190 bits) of the corrected data are sent to buffer storage 19 and loaded in the area, as the other 82 parity bits are unnecessary. In the fourth operation mode, correct gate signal 39 prohibits error correction signal 40 from passing through correct gate 38, and the corrected data held in data register 24 are sent to data transfer circuit 20 as corrected data 42, and get serial-parallel converted at it, and are loaded in buffer storage 19 via local data bus 13.

Figure 8:
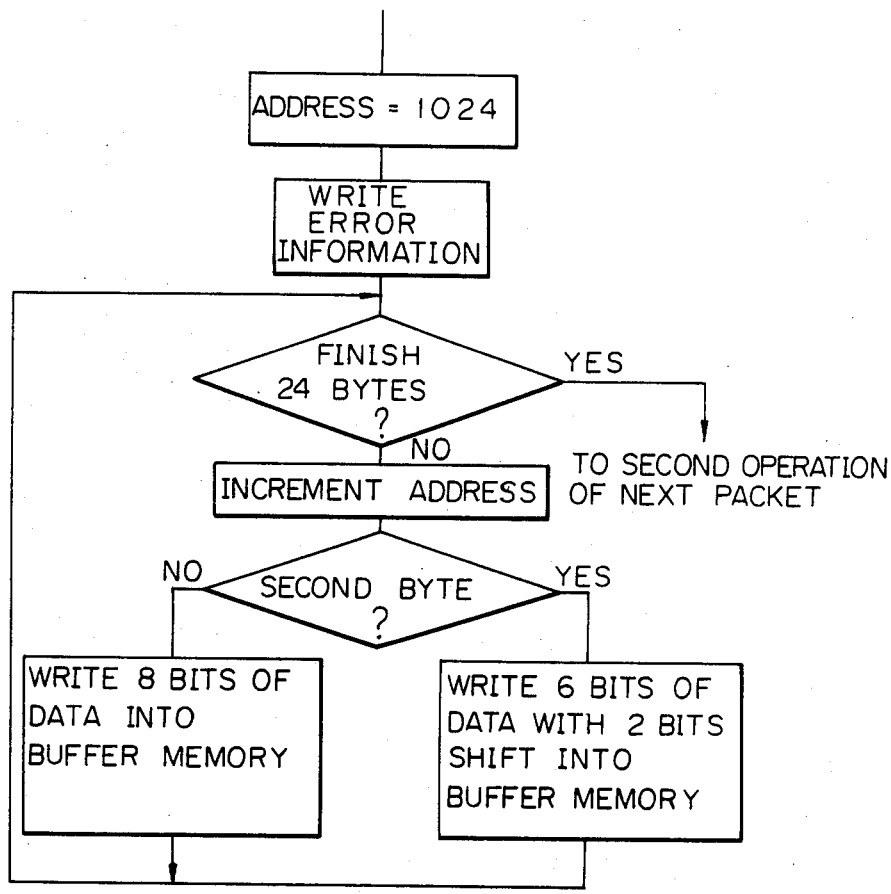
FIG. 8 is still another flow diagram for the explanation of the embodiment.

As shown in the Japanese patent laid open publication No. 216388/84, the head part of a packet of data (=272 bits) in a SI/IN of 8 bits that indicates service discrimination and interrupt priority by the (8, 4) extended Hamming Code, next comes a packet control (PC) composed of 6 bits, and then follow 22 bytes of pure information bits. Accordingly, if the corrected data are loaded byte by byte in order, the first 2 bits of each pure information byte are held in the last two bit-positions of the proceeding byte. To avoid the problem, in this embodiment, two additional bits are added to the PC so that it becomes a byte. This is the same way as shown in the Japanese patent laid open publication No. 216388/84. Therefore, the part for the information bits of a packet of data occupies 24 bytes of area in the buffer storage, and total of 25 bytes including one error information byte added at the top of the said 24 bytes, are loaded into the buffer storage as the corrected data of a packet of data. FIG. 8 shows a flow diagram of the above explained process.

During the fourth operation mode explained above, timing control circuit 17 sends write-pulse signal 45 to buffer storage 19 and address updating signal 54 to address generation circuit 15 at every sending of a byte of corrected data from data transfer circuit 20. Address updating signal 54 updates automatic address signal 16 at address generation circuit 15. In the fourth operation mode, address switching circuit 14 selects automatic address signal 16 and sends it to the address input terminal of buffer storage 19 as in the previous operation mode. And data bus control circuit 12 continues to work to separate CPU's data bus 10 and local data bus 13, and so CPU can control some other jobs during the fourth operation mode.

The second operation mode, the third operation mode, and the fourth operation mode explained above are a series of operations which take place one after another. That is, the original data of one packet are read out from buffer storage 19, and are loaded into syndrome register 26 and data register 24 (in the second operation mode), errors in them, if any, are corrected (in the third operation mode), and the corrected data thus obtained are loaded into buffer storage 19 with a byte of error information. (in the fourth operation mode.) When the series of operations gets completed, another series of operations that is for the second packet begins, and each operation of the series is executed in the same way. The process continues until the corrected data of the 12th packet are loaded into the buffer storage. Thus, the corrected data of 12 packets are loaded in a storage area of buffer storage 19 as shown in FIG. 9. In FIG. 9, a storage area of 64 addresses is assigned to the corrected data of one packet, where 25 addresses are actually used for storage, and the other 39 addresses remain unused.

When the corrected data of all the packets are loaded into buffer storage 19 as shown in FIG. 9, timing control circuit 17 sends status signal 48 to CPU to notify that CPU is ready to read out buffer storage 19.

The fifth operation mode is a mode in which CPU reads out what is stored in the fourth operation mode from the buffer storage, upon receiving status signal 48. In this operation mode, CPU sends data request signal 56 to timing control circuit 17. When timing control circuit 17 receives the said data request signal 56, timing control circuit 17 sends bus control signal 18 to both data bus control circuit 12 and address switching circuit 14. By means of this, bus control circuit 12 works to connect CPU's data bus 10 to local data bus 13, and address switching circuit 14 provides the signal on CPU's address bus 11 to buffer storage 19. Thus, any storage area of the buffer storage, addressed by CPU, is read out and the read-out data are available on CPU's data bus 10 by way of local data bus 13.

In the explanation given above, the capacity of local data bus 13 is 8 bits and data are transferred between buffer storage 19 and data transfer circuit 20 by 8 bits at a time. But this is an example and other bit-capacities, e.g., 16 bits or 4 bits, are possible. In the 16 bit capacity case, however, the SI/IN and PC mentioned earlier should be combined to make a 14 bit word, which requires additional 2 bits to be transferred at a time.

The capacity of data register 24 is not necessarily 272 bits. It may be chosen as 190 bits for only the information bits of a packet of data. In this case, however, load clock signal 35 and correction clock signal 36 are prohibited from inputting into data register 24 during the time for the rest of 82 bits.

In the explanation given above, the error information for a packet of data can be held in one byte word including the corresponding error status signal, correction exceed signal and correction number signal.

If an increased number is required for the correction number's maximum value, a plural number of bytes can be assigned to error information. The threshold values for majority decision in the above example are given from 17 through 9, but they can be chosen differently due to what the invention claims.

Figure 1:
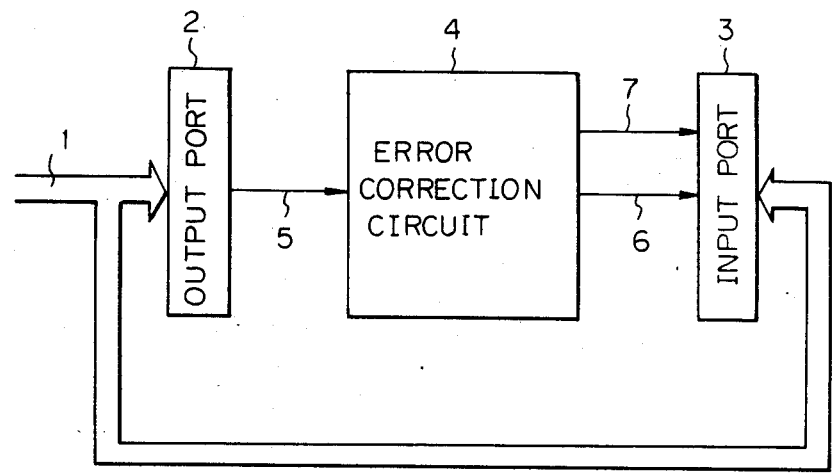
FIG. 1 is a circuit diagram of a prior error correction system.
Figure 10:
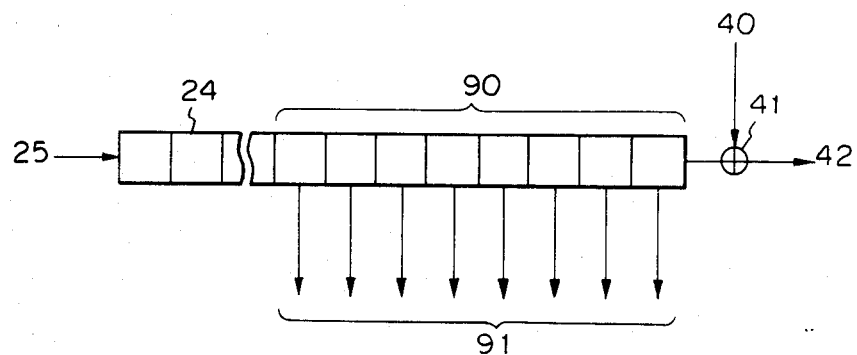
FIG. 10 is a circuit showing the second embodiment of the present invention.

In the first embodiment shown above, corrected data are given at the output of adder 41 as signal 42, and are converted from serial to parallel by data transfer circuit 20. In the second embodiment, the required serial-parallel conversion is carried out at data register 24 as illustrated in FIG. 10. In FIG. 10, those denoted by 24, 25, 40 and 41 respectively are the same as those referred to by the corresponding figures in FIG. 2. But the signal denoted by 42 in FIG. 10 is not corrected data 42 in FIG. 2 that is for final use. It is only used in the course of the error correcting cycles with descending threshold values to modify the data register. In FIG. 10, 90 stands for the first 8 bit-positions of data register 24, and 91 stands for the output signal of register bit-positions 90 that is sent to data transfer circuit 20 by a bus of 8 bit capacity not shown here, as corrected data. All data transfer circuit 20 has to do in this case is to latch signal 91 and send it out on local data bus 13 in a right timing.

In the first embodiment, data obtained at the end of the correcton cycle, i.e., at the lowest threshold value of 9, that are not corrected properly, or data obtained when the correction number for them exceeds a predetermined value, are loaded in a storage area of the buffer storage assigned for corrected data. In these incorrectable cases, the original data is sure to contain a lot of errors, and the error correction with such original data may produce more errors than those contained initially.

In these incorrectable cases, the third embodiment of the invention is proposed as shown below.

The information bits of a packet of original data, stored somewhere in buffer storage 19 are read out and, by adding two additional bits to its PC, total of 24 bytes are obtained. These 24 bytes with one byte of error information obtained in the correction process for the original data, are loaded into a storage area of buffer storage 19 reserved for the corresponding corrected data. In this way, CPU can read out the information bits of original data arranged for easy manipulation in CPU with their error information. It is certain that the read out data contain less errors than their corrected counterpart.

An error correction system realized by the invention has a buffer storage, in which storage areas for original data and the corresponding corrected data are reserved, and has a data transfer circuit which performs a series of operations, i.e., loading of received original data into the buffer storage, reading out of the original data from the buffer storage and loading of the corrected data obtained in error correction of the original data into the buffer storage automatically. Thus, the CPU time for error correction can be reduced to a great degree.

A feature hereof is a counter that counts the number of corrected bits occurring in the course of error correction, and if the number exceeds a predetermined value, generates a signal that causes the correction process in progress to stop. This brings about a shortened correction time.

Therefore, the invention can be applied not only to receiving equipment for use in a teletext broadcast, but to a wide range of digital devices for error correction using cyclic code and majority.

From the foregoing it will now be apparent that a new and improved error correction system has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. An error correction system comprising
   (a) a buffer memory (19) for storing an original data which is subject to correction from an external circuit, and corrected data which is to be sent to the external circuit,
   (b) a local data bus (13) for coupling said buffer memory and an error correction circuit,
   (c) an address switching circuit (14) for switching an address of said buffer memory (19) between an address signal supplied by said error correction circuit, and an address signal from an external circuit,
   (d) a data bus control circuit (12) for coupling either said local data bus (13) or a bus of an external circuit with said buffer memory (19),
   (e) said error correction circuit having at least:
   an address generator for indicating an address of a buffer memory to read and write a signal responsive to a timing signal,
   a data transfer circuit (20) coupled with said local data bus (13), for receiving an original data in parallel form from said buffer memory through said local data bus and converting the received signal to serial form, for receiving corrected data in serial form and sending the same to the local data bus after converting the signal to parallel form, and for receiving an original data in serial form from an external circuit and sending the same to said local data bus after converting the signal to parallel form through said local data bus;
   a syndrome register (26) for receiving a serial data which is subject to correction from said data transfer circuit, and providing syndrome data which shows error conditions;

a majority circuit (31) which receives said syndrome data, and provides an error correction signal when a number of bits with predetermined level in said syndrome data exceeds a predetermined amount;

a data register (24) for shifting serial data from said data transfer circuit, means for inverting serial data from said data register according to said error correction signal, and sending the inverted corrected data to said data transfer circuit, and a timing control (17) for supplying timing signals for operation of the error correction circuit, (f) wherein data transfer between said buffer memory (19) and said error correction circuit is effected by wired hardware means.

2. An error correction system according to claim 1, wherein said buffer memory (19) has an area for storing an original data which is subject to correction, and another area for storing corrected data.

3. An error correction system according to claim 1, wherein said address generator (15) determines an address for storing a reception signal by counting a number of horizontal synchronization pulse signals in a reception television signal.

4. An error correction system according to claim 1, wherein said data transfer circuit (20) comprises means for transferring reception data to a local data bus according to a framing signal in a packet of a teletext signal and a signal synchronized with a clock-run-in signal in a packet of said teletext signal.

5. An error correction system according to claim 1, further comprising a correction number counter which counts the error correction signal generated at output of said majority circuit, and sends a correction number signal that indicates the number held in the counter, and a correction exceed signal when said number exceeds a predetermined value, to said error correction circuit.

* * * * *